US010175099B2

(12) United States Patent
Wang et al.

(10) Patent No.: US 10,175,099 B2
(45) Date of Patent: Jan. 8, 2019

(54) EDGE-COUPLED SEMICONDUCTOR PHOTODETECTOR

(71) Applicant: Global Communications Semiconductors, LLC, Torrance, CA (US)

(72) Inventors: Samuel C. Wang, Rolling Hills Estates, CA (US); Peter Lao, Torrance, CA (US); Dhiraj Kumar, Encino, CA (US)

(73) Assignee: GLOBAL COMMUNICATION SEMICONDUCTORS, LLC, Torrance, CA (US)

( * ) Notice: Subject to any disclaimer, the term of this patent is extended or adjusted under 35 U.S.C. 154(b) by 0 days.

(21) Appl. No.: 15/668,639

(22) Filed: Aug. 3, 2017

(65) Prior Publication Data

US 2018/0180468 A1    Jun. 28, 2018

Related U.S. Application Data

(60) Provisional application No. 62/439,882, filed on Dec. 28, 2016.

(51) Int. Cl.
| | |
|---|---|
| *G01J 1/02* | (2006.01) |
| *G01J 1/04* | (2006.01) |
| *G02B 6/42* | (2006.01) |
| *H01S 5/0683* | (2006.01) |

(52) U.S. Cl.
CPC .......... *G01J 1/0414* (2013.01); *G01J 1/0209* (2013.01); *G02B 6/4286* (2013.01); *H01S 5/0683* (2013.01)

(58) Field of Classification Search
CPC ...... H01L 31/02327; H01L 31/035281; G02B 6/4214; H01S 5/0683; H01S 5/02248
See application file for complete search history.

(56) References Cited

U.S. PATENT DOCUMENTS

| | | | | |
|---|---|---|---|---|
| 6,483,098 B1 * | 11/2002 | Kato | ................ | G02B 6/4214 250/214.1 |
| 2003/0063651 A1 * | 4/2003 | Tsumori | ............ | H04B 10/501 372/108 |
| 2004/0129935 A1 * | 7/2004 | Blauvelt | ............ | G02B 6/4204 257/40 |

\* cited by examiner

*Primary Examiner* — Thanh Luu
(74) *Attorney, Agent, or Firm* — Morgan, Lewis & Bockius LLP

(57) ABSTRACT

A device is disclosed for monitoring power from a laser diode. The device includes a substrate having a top surface and a first facet perpendicular to the top surface through which light enters the substrate. The device further includes a second facet onto which light that has entered the substrate through the first facet along an optical axis that is non-normal to the first facet is incident. The device further includes a photodiode fabricated on the top surface of the substrate for measuring an intensity of the light that enters the first facet of the substrate along the optical axis that is non-normal to the first facet. The light that has entered the substrate through the first facet along the optical axis that is non-normal to the first facet is reflected by the second facet toward a photoactive region of the photodiode.

20 Claims, 6 Drawing Sheets

EDGE-COUPLED SEMICONDUCTOR PHOTODETECTOR

RELATED APPLICATIONS

This application claims priority to U.S. Provisional Patent Application 62/439,882, filed Dec. 28, 2016, which is hereby incorporated by reference in its entirety.

TECHNICAL FIELD

The present application relates generally to semiconductor devices (e.g., photodetectors) used to monitor power from a laser diode. In some embodiments, the semiconductor devices are used in optical communications.

BACKGROUND

Optical communication, also known as optical telecommunication, is communication at a distance using light to carry information. An optical communication system uses a transmitter to encode a message in an optical signal, a channel to carry the signal to its destination, and a receiver to reproduce the message from the received optical signal.

An optical fiber is the most common type of channel for optical fiber communications. The transmitters in optical fiber communications are typically laser diodes. Infrared light or visible light can be used, although infrared light is more commonly used because it is transmitted through optical fibers with less attenuation and dispersion than visible light. The signal encoding is typically simple intensity modulation, although optical phase and frequency modulation are also possible.

As explained in further detail below, natural variations in operating conditions affect the optical power output of laser diodes. As shown in FIG. 1, a conventional transmitter 100 uses a top-side coupled photodiode 102 to detect the intensity of laser backlight (light emitted from the back facet of a laser diode 104) as a feedback signal to monitor and control the optical output power. The conventional packaging approach positions photodiode 102 in an L-shaped configuration with respect to laser diode 104 so that light emitted from laser diode 104 is incident on a top-side of photodiode 102. One problem with this approach is that it requires a bulky and expensive "wrap-around" sub-mount 106.

SUMMARY

The embodiments described herein include a photodiode device (e.g., a chip that includes a photodiode) that can be mounted on a single, flat, surface of a sub-mount together with a laser diode whose optical power output the photodiode device is monitoring. To that end, the photodiode device includes a photodiode fabricated on a substrate. The photodiode device, sometimes called a monitor photodiode or edge-coupled monitor photodiode, receives light through a first facet of the substrate, sometimes called a side or edge surface of the substrate, and internally reflects the received light off a second facet (e.g., a facet of the substrate formed by etching) toward a photoactive region of the photodiode. The photodiode device is designed to receive light through the first facet at a non-normal angle so that reflected light is not reflected back toward the laser diode.

The embodiments described herein also provide an assembly that includes a photodiode device, as described in the preceding paragraph, and a laser diode whose optical power output the photodiode device is monitoring. In some embodiments, the laser diode is a transmitter in an optical communications system (e.g., the laser diode transmits modulated light to a remote destination via an optical fiber). The photodiode device, which in some embodiments is not a flip-chip, is disposed on the same flat common surface of a sub-mount as the laser diode. The photodiode device is rotated with respect to the laser diode along an axis perpendicular to the flat surface of the sub-mount so that the optical axis of the photodiode is aligned with a principal direction of propagation of the light produced by the laser diode. In some embodiments, the assembly is disposed within a transistor outline package (more commonly referred to as a TO package or, more specifically, a TO can).

BRIEF DESCRIPTION OF THE DRAWINGS

Like reference numerals refer to corresponding parts throughout the drawings.

Figure 1:
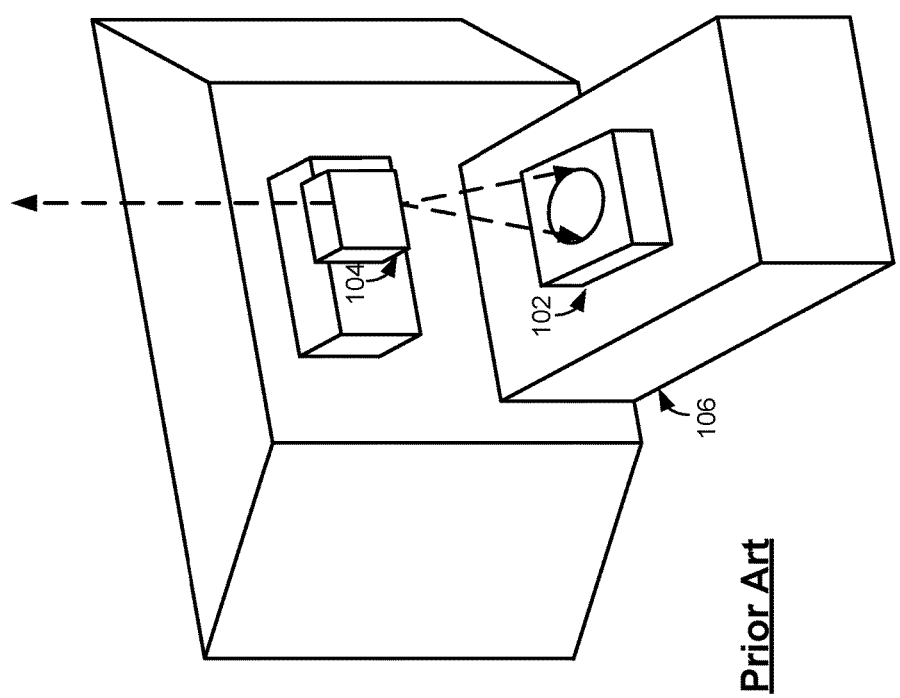
FIG. 1 is a perspective view of a portion of an optical transmitter having a "wrap-around" sub-mount.

DESCRIPTION OF EMBODIMENTS (A1) To address the problems noted above, some embodiments provide a device for monitoring optical power intensity. The device includes a substrate. The substrate has a top surface, a first facet perpendicular to the top surface through which light enters the substrate, and a second facet onto which light that has entered the substrate through the first facet along an optical axis that is non-normal to the first facet is incident. The device further includes a photodiode fabricated on the top surface of the substrate for measuring an intensity of the light that enters the first facet of the substrate along the optical axis that is non-normal to the first facet. The light that has entered the substrate through the first facet along the optical axis that is non-normal to the first facet is reflected by the second facet toward a photoactive region of the photodiode.

(A2) In some embodiments of the device of A1, the first facet is a side surface of the substrate.

(A3) In some embodiments of the device of either A1-A2, wherein the first facet is a cleavage plane of the substrate.

(A4) In some embodiments of the device of any of A1-A3, the second facet is a facet that was etched into the substrate.

(A5) In some embodiments of the device of any of A1-A4, the optical axis is parallel to the top surface of the substrate.

(A6) In some embodiments of the device of any of A1-A5, the non-normal predetermined direction is at least 7 degrees off of a normal direction to the first facet.

(A7) In some embodiments of the device of any of A1-A6, under operating conditions, the light that has entered the substrate through the first facet along the optical axis is totally internally reflected by the second facet.

(B1) To further address the problems noted above, some embodiments provide an assembly. The assembly includes a sub-mount having a mounting surface. A laser diode is mounted on the mounting surface of the sub-mount. The laser diode has a back facet that emits light principally along a first direction. The assembly includes a photodiode chip mounted on the mounting surface of the sub-mount. The photodiode chip comprises a substrate having a top surface and a first facet perpendicular to the top surface through which light emitted from the back facet of the laser diode is incident. The photodiode chip is rotated with respect to the back facet of the laser diode so that light emitted principally along the first direction from the back facet of the laser diode enters the substrate through the first facet along an optical axis of the photodiode chip that is non-normal to the first facet. The photodiode chip includes a second facet onto which the light that has entered the substrate through the first facet along the non-normal optical axis is incident. The assembly further includes a photodiode fabricated on the top surface of the substrate for measuring an intensity of the light that has entered the substrate through the first facet along the non-normal optical axis. The light that has entered the substrate through the first facet along the non-normal optical axis is reflected by the second facet toward a photoactive region of the photodiode.

(B2) In some embodiments of the assembly of B1, a bottom surface of the substrate is mounted to the mounting surface of the sub-mount.

(B3) In some embodiments of the assembly of either B1 or B2, the photodiode chip monitors an intensity of light emitted from a front facet of the laser diode based on the measured intensity of the light that has entered the substrate of the photodiode chip from the back facet of the laser diode.

(B4) In some embodiments of the assembly of any of B1-B3, the assembly further includes feedback circuitry for stabilizing the intensity of the light emitted from the front facet of the laser diode based on the measured intensity of the light that has entered the substrate from the back facet of the laser diode.

(B5) In some embodiments of the assembly of any of B1-B4, the first facet is a side surface of the substrate.

(B6) In some embodiments of the assembly of any of B1-B5, the first facet is a cleavage plane of the substrate.

(B7) In some embodiments of the assembly of any of B1-B6, the second facet is a facet that was etched into the substrate.

(B8) In some embodiments of the assembly of any of B1-B7, the back facet of the laser diode is perpendicular to the mounting surface of the sub-mount.

(B9) In some embodiments of the assembly of any of B1-B8, the first facet of the substrate is perpendicular to the mounting surface of the sub-mount.

(B10) In some embodiments of the assembly of any of B1-B9, the top surface of the substrate is parallel to a surface of the sub-mount.

(B11) In some embodiments of the assembly of any of B1-B10, the first facet of the photodiode chip is rotated at least 7 degrees with respect to the back facet of the laser diode in a plane of the mounting surface of the sub-mount.

(B12) In some embodiments of the assembly of any of B1-B11, under operating conditions, the light that has entered the substrate through the first facet from the back facet of the laser diode is totally internally reflected by the second facet.

(B13) In some embodiments of the assembly of any of B1-B12, the photodiode chip has any of the features of the device of A1-A7.

Reference will now be made in detail to various embodiments, examples of which are illustrated in the accompanying drawings. In the following detailed description, numerous specific details are set forth in order to provide a thorough understanding of the present disclosure and the described embodiments herein. However, embodiments described herein may be practiced without these specific details. In other instances, well-known methods, procedures, components, and mechanical apparatus have not been described in detail so as not to unnecessarily obscure aspects of the embodiments.

Figure 2A:
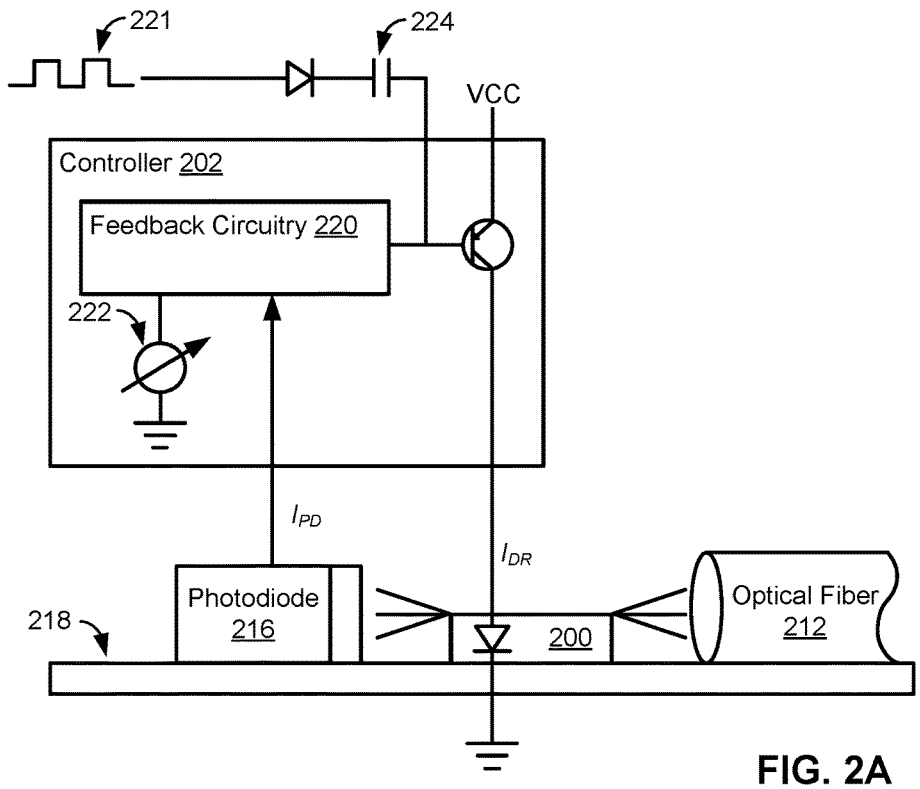
FIG. 2A illustrates a laser diode and a laser diode controller, in accordance with some embodiments.

FIG. 2A illustrates a laser diode 200 and a laser diode controller 202, in accordance with some embodiments. Laser diode 200, sometimes called an edge-emitting laser or edge-emitting laser diode, has a front facet which emits coherent light that is to be transmitted, usually into an optical component such as an optical fiber 212, and a back facet. Light emitted from the back facet is received by a photodiode chip 216, which includes a photodiode. The photodiode produces a photocurrent that affects the magnitude of a photodiode current $I_{PD}$. The photodiode current $I_{PD}$ is used to continuously monitor the optical power being output by laser diode 200. In general, the amount of optical power output by the front facet is directly proportional to the optical power output by the back facet:

$$P_{ff}=P_{bf}/K \quad (1)$$

In the equation above, $P_{ff}$ is the optical power output from the front facet, $P_{bf}$ is the optical power output from the back facet and K is a constant of proportionality. While K is often much smaller than 1 (e.g., having a value between 0.05 and 0.15), the amount of back facet power received by the photodiode varies considerably from package to package, and therefore is generally separately calibrated for each laser diode.

In some embodiments, laser diode 200, photodiode chip 216, and outgoing optical fiber 212 (or a mechanism for holding the outgoing optical fiber 212) are all mounted on a common mounting surface (e.g., a flat mounting surface) of a sub-mount 218. In some embodiments, sub-mount 218 includes a solid state thermoelectric cooler for maintaining laser diode 200 at a specified temperature.

Figure 2B:
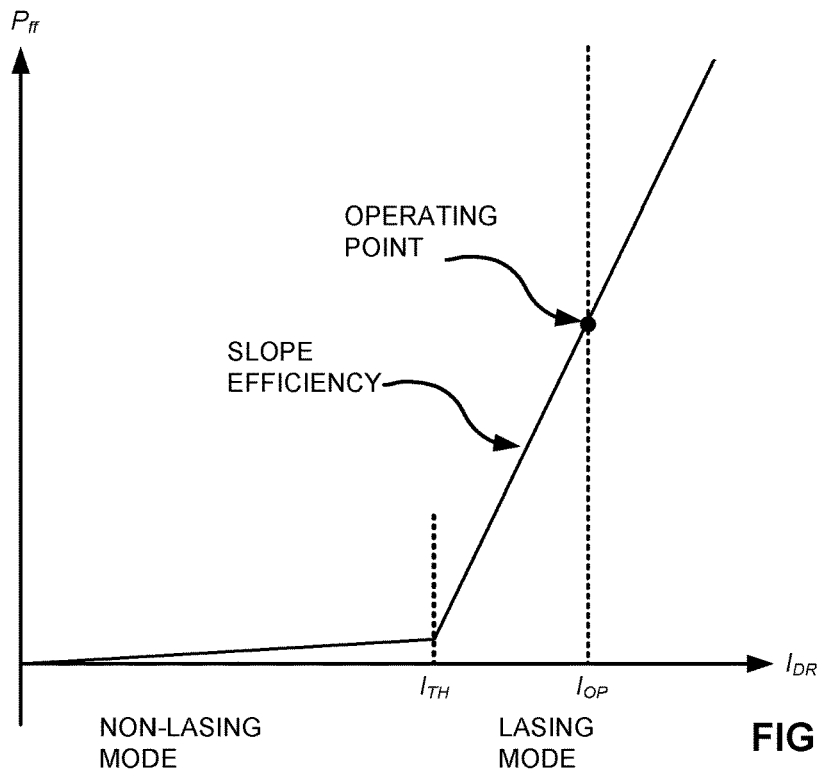
FIG. 2B depicts a graph of the relationship between drive current and optical output power for a laser diode, in accordance with some embodiments.

Referring to FIG. 2B, the optical output power of laser diode 200 is a non-linear function (e.g., a piecewise linear function, until high power saturation) of laser diode 200's drive current. In particular, when a forward bias current is applied to a semiconductor laser it begins to emit light in a manner similar to a light emitting diode (LED). This type of emission is known as spontaneous emission because it happens randomly from excited atoms in laser diode 200's cavity, and is sometimes called a non-lasing mode of operation. The optical output power in the non-lasing mode of operation is typically very low, close to zero in comparison with the optical output power when the laser diode is operating in the lasing mode of operation.

At a certain drive current, herein called the threshold current, $I_{TH}$, laser diode 200's efficiency in converting current into light increases dramatically. This is the point where laser diode 200 changes from non-lasing mode of operation to the lasing mode of operation (in which emission of light is stimulated rather than spontaneous).

While various classes of laser diodes will have thresholds in the same general range of currents, the threshold current $I_{TH}$ varies considerably among laser diodes of the same type and also varies with the temperature and age of the laser diode. For example, the threshold current of some laser diodes can vary by as much as fifty percent or more with changes in temperature. The effect of this temperature sensitivity is that at a given drive current the laser diode could be operating above its recommended levels at one temperature while not even lasing at another temperature.

When laser diode 200 is operating in the lasing mode (that is, at a drive current in excess of the threshold current), there is a characteristic slope that determines laser diode 200's efficiency. More specifically, each laser diode's "slope efficiency" is equal to the ratio of changes in the laser diode's optical output power to changes in the drive current while operating in the lasing mode. Slope efficiency varies from laser diode to laser diode, and also varies with temperature and with the age of the diode.

Thus, to maintain a predictable optical output power, which is key to encoding and recovery of a modulated transmission signal, monitoring and stabilization of the output power through feedback circuitry controlling the drive current is necessary.

The "operating point" or bias current, $I_{OP}$, for a diode laser is generally set so that it is within the current range for the lasing mode of operation, and so that the laser diode remains in lasing mode when the current is modulated by an input signal. Thus, if the maximum variation of the input signal below the operation point is MV, the operation point must be greater than $I_{TH}$+MV. In addition, the operation point must be set sufficiently high that a receiving photodiode will be able to receive the transmitted light, and yet the operation point must not be set so high as to burn out the laser diode.

Referring back to FIG. 2A, diode controller 202 includes feedback circuitry 220 coupled to a potentiometer 222, or some other similar mechanism, for adjusting laser diode 200's operating point. The user typically turns down the gain of feedback circuitry 220 (e.g., by adjusting potentiometer 222) before powering on laser diode controller 202, and then adjusts the gain upward until the desired amount of optical output power is achieved. After laser diode controller 202 is calibrated using potentiometer 222, a transmitted signal 221 is superimposed on laser diode 200's operating point current $I_{OP}$ by a capacitor 224, forming a drive current $I_{DR}$ and thereby modulating the output power of laser diode 200. Some analog controllers employ multiple potentiometers to separately set the threshold current, operating bias current, and back facet photodiode feedback control. In some embodiments, calibration of laser diode 200, and laser diode controller 202 (including feedback circuitry 220) is performed in an automated fashion.

Figure 3:
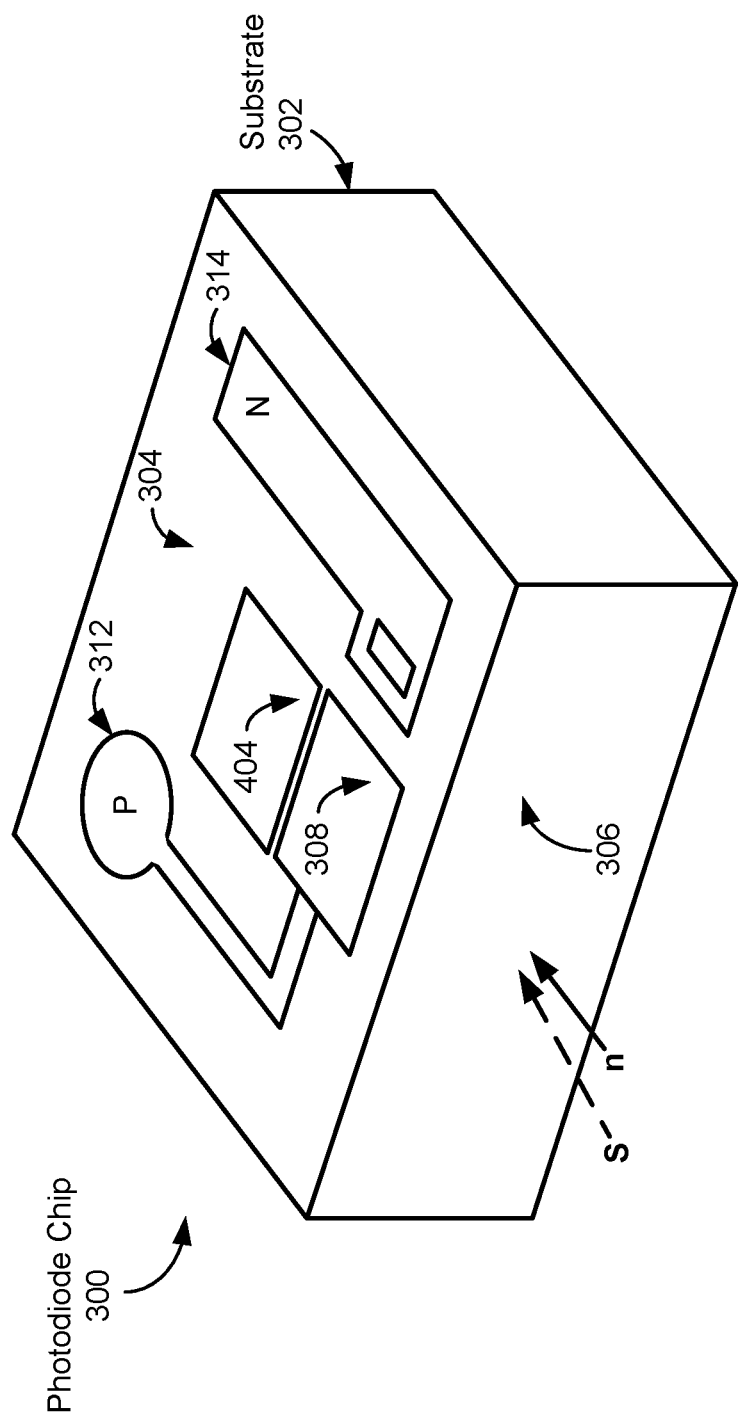
FIG. 3 illustrates a photodiode chip, in accordance with some embodiments.
Figure 4:
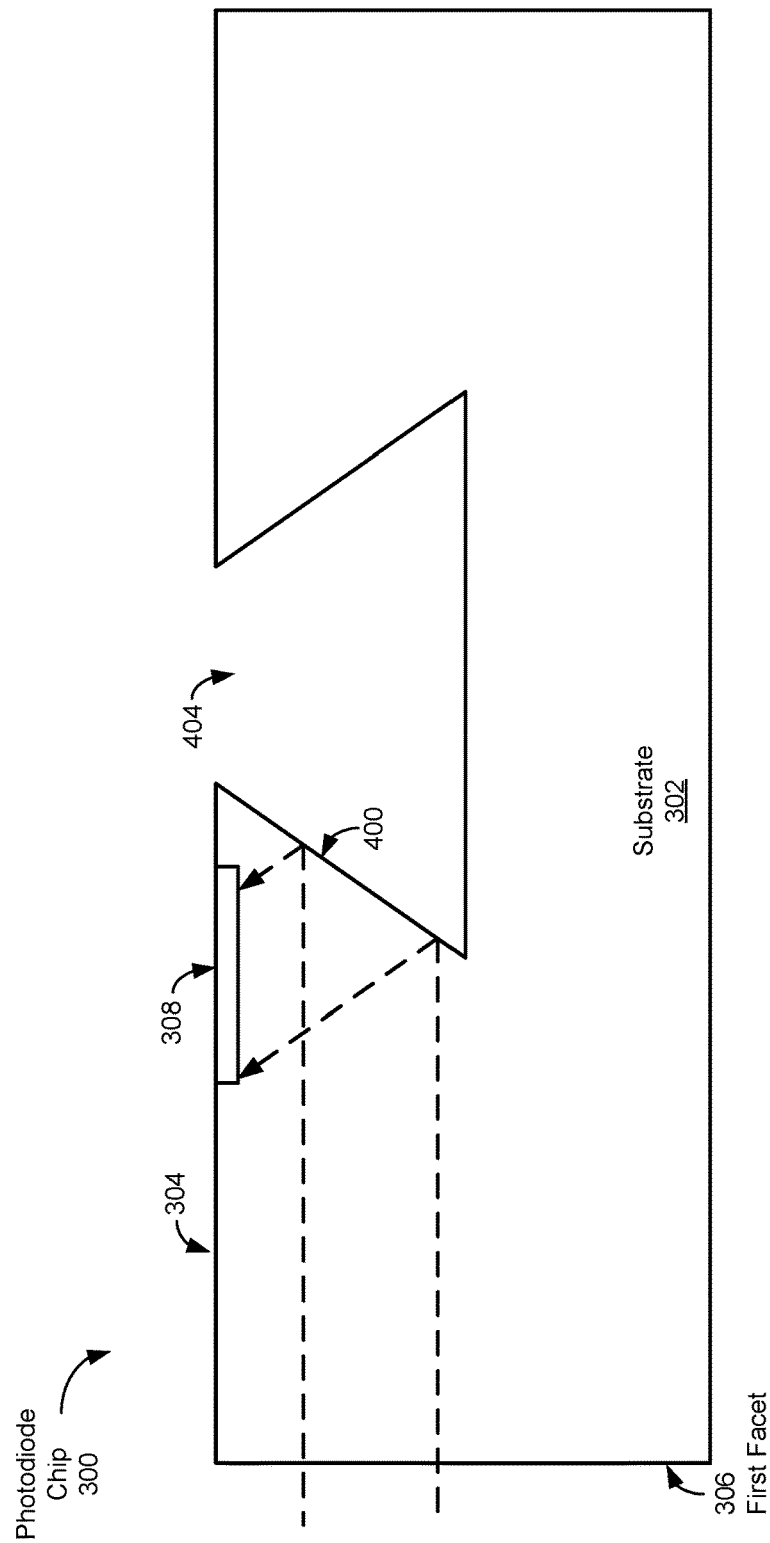
FIG. 4 illustrates a cross-section view of a photodiode chip, in accordance with some embodiments.

FIGS. 3-4 should be viewed together. FIG. 3 illustrates a photodiode chip 300, in accordance with some embodiments. FIG. 4 illustrates a cross-section view of photodiode chip 300, in accordance with some embodiments. As described below, the photodiode chips described herein include both a photodiode as well as optical components that direct light toward a photoactive region of the photodiode. In some embodiments, once light enters the photodiode chip, light is directed internally until it is incident upon the photoactive region of the photodiode. An optical component is anything upon which light is reflected and/or through which light is transmitted and/or refracted. In some embodiments, the optical components of the photodiode chip include facets of the photodiode chip (for reflection, transmission, and refraction) and a bulk medium (e.g., a transmission medium for the light) which may comprise the substrate upon which the photodiode is fabricated.

To that end, as shown in FIG. 3, photodiode chip 300 (an optoelectronic device) includes a substrate 302 (e.g., a semiconductor substrate such as an indium phosphide (InP) substrate). Substrate 302 has a top surface 304 and a first facet 306 perpendicular to top surface 304 through which light enters substrate 302. First facet 306 is sometimes called a side surface or an edge surface of photodiode chip 300, and photodiode chip 300 can be called a monitor photodiode or edge-coupled monitor photodiode, because it monitors light received via an edge surface of the monitor photodiode. Because photodiode chip 300 and its photodiode 308 are implemented using semiconductor elements, it can be called a semiconductor photodetector or edge-coupled semiconductor photodetector.

As shown in FIG. 4, photodiode chip 300 includes a second facet 400. Referring to both FIG. 3 and FIG. 4, light that has entered substrate 302 through first facet 306 along an optical axis S that is non-normal to first facet 306 is incident on second facet 400. The direction n indicates a direction normal to first facet 306. Photodiode chip 300 includes photodiode 308 fabricated on top surface 304 of substrate 302 for measuring an intensity of the light that enters first facet 306 of substrate 302 along the optical axis S that is non-normal to first facet 306. In some embodiments, light incident on first facet 306 along the non-normal optical axis S is propagated through substrate 302 from first facet 306 to second facet 400. That light is then reflected by second facet 400 (e.g., reflected within substrate 302) toward a photoactive region of photodiode 308. In some embodiments, light received along the non-normal optical axis S enters substrate 302 through first facet 306, is incident upon second facet 400, and is reflected by second facet 400 toward a center of the photoactive region of photodiode 308.

Figure 6B:
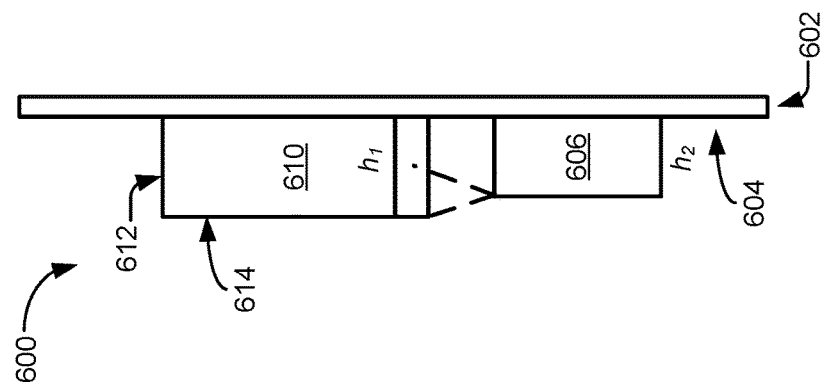
FIGS. 6A-6B illustrate various views of an assembly that includes a laser diode and a photodiode, in accordance with some embodiments.
Figure 6A:
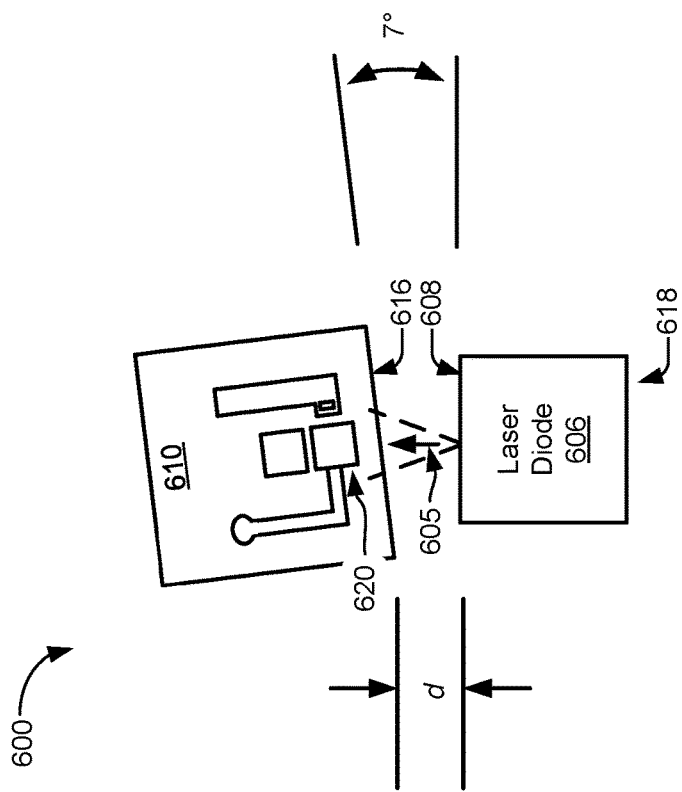

In some embodiments, the optical axis S is parallel to top surface 304 of substrate 302 (e.g., the optical axis S lies parallel to the plane of a surface of a sub-mount as shown with respect to FIGS. 6A-6B).

In some embodiments, the optical axis S is at least 7 degrees off of the direction n normal to first facet 306. More generally, the optical axis S is between 5-30 degrees off of the direction n normal to first facet 306. Stated another way, in some embodiments the angle between optical axis S and the direction n normal to first facet 306, in a plane parallel to the top surface 304 of substrate 302, is at least 7 degrees and more generally is between 5 and 30 degrees. Because the optical axis S is not aligned with the normal direction n, light reflected by first facet 306 (as opposed to light transmitted into substrate 302) is not reflected back to its source (e.g., a laser diode), thereby avoiding damage to the light source (e.g., the laser diode). Direction n is direction that is normal to first facet 306, and is sometimes described as a normal direction to first facet 306.

The term "optical axis" means an axis along which a device (e.g., photodiode chip 300) is designed to receive light. For example, photodiode chip 300 is designed so that a ray of light incident along the optical axis at an entry point or region of first facet 306 is traced (e.g., optically routed by the physical configuration of photodiode chip 300) to the photoactive region of photodiode 308 (e.g., a center region of photodiode 308). Stated another way, light incident on the photodiode chip along the optical axis of the photodiode chip is directed, by the physical configuration of the photodiode chip, to (and received at) the photoactive region of photodiode 308, and is typically directly to a center region of photodiode 308. Thus, the optical axis S is a feature or property of the device (the intended or designed direction along which light is received).

In some embodiments, when photodiode chip 300 is incorporated into an assembly (as described elsewhere in this document) photodiode chip 300 is positioned and/or rotated with respect to a laser diode so that a principal direction of propagation of the laser diode's light is aligned with photodiode chip 300's optical axis S. For example, in an assembly, photodiode chip 300 monitors an intensity of light emitted from a back facet of a laser diode (e.g., photodiode chip 300 is a photodetector for the laser diode). In the assembly, the light emitted from the back facet of the laser diode has a principal direction of propagation that is aligned with the optical axis S along which photodiode chip 300 is designed to receive light.

Of course, due to refraction and reflection, the principal direction of propagation changes as the light moves through the device. For example, when light enters first facet 306 along the optical axis S, the light is refracted within substrate 302 because of the difference in refractive indices inside and outside of substrate 302. Thus, light that has just entered substrate 302 along the optical axis S propagates along a direction other than the optical axis S.

Figure 5:
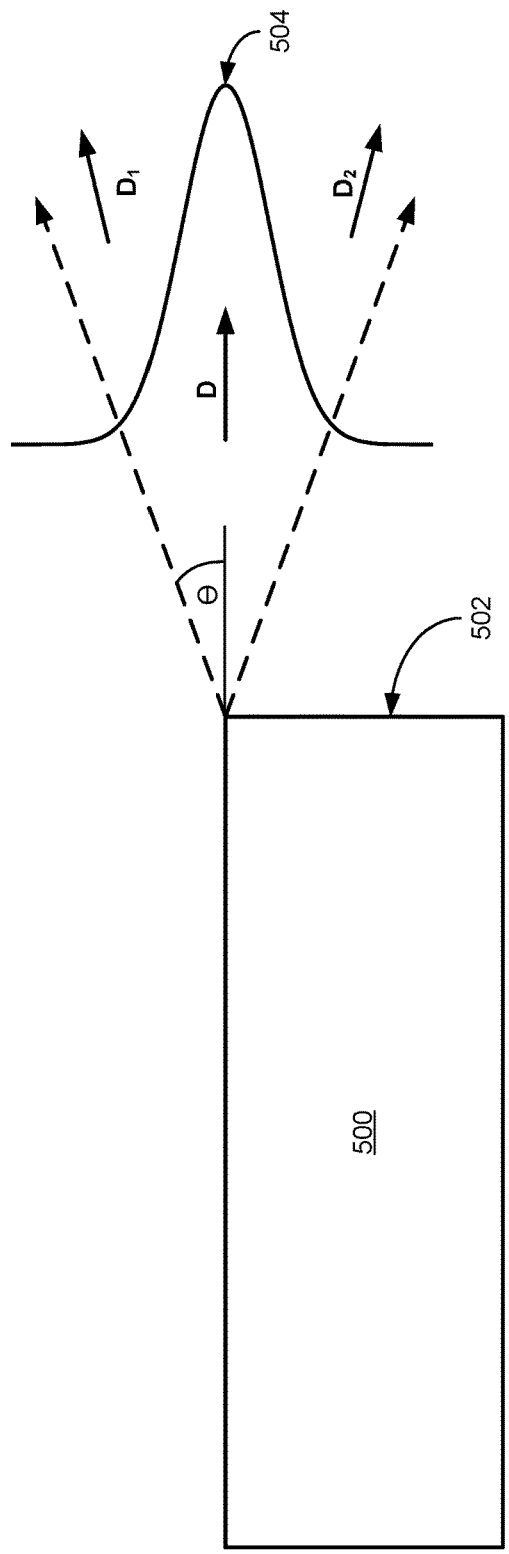
FIG. 5 illustrates optical properties of light emitted from a laser diode, in accordance with some embodiments.

As shown in FIG. 5, in some circumstances, light emitted by a laser diode 500 will have a beam divergence θ (e.g., the light will be shaped like a cone). Despite having a beam divergence, for the purposes of this disclosure, light emitted from a laser diode (emitted from either the back facet or front facet) is considered to have a single principal direction of propagation. For example, laser diode 500 emits light from a back facet 502 along a principal direction of propagation D. Not all light emitted from back facet 502, however, propagates along the principal direction of propagation D. For example, the light emitted from back facet 502 also includes rays $D_1$ and $D_2$ that propagate along a direction different from the principal direction of propagation D. In fact, light produced by a laser diode will generally have a smoothly spatially decaying distribution 504 (e.g., a Gaussian distribution). For the purposes of this disclosure, a beam of light is considered to have a footprint (or boundary) defined such that 95% of the light is contained within the footprint.

The principal direction of propagation D of a beam of light can be defined and/or determined in any number of ways. For example, the principal direction of propagation is a direction of maximum energy flux for a beam of light or a direction of average energy flux for a beam of light. In reality, the difference between the average and maximum directions of energy flux, or any other reasonable way of calculating the principal direction of propagation, will be minute and likely within the tolerances of the device design. The term "principal direction of propagation" describes a property of a beam of light. Likewise, when light is described as emitted or travelling "principally along a first direction," the light's principal direction of propagation is the first direction.

Returning to FIGS. 3-4, in some embodiments, first facet 306 is an entrance facet for light. In some embodiments, first facet 306 is coated with an antireflective coating. In some embodiments, first facet 306 is a side surface of substrate 302. In some embodiments, first facet 306 is a cleavage plane of substrate 302 (e.g., a crystallographic plane of substrate 302).

In some embodiments, second facet 400 is slanted with respect to top surface 304 (e.g., at an angle between 0-90 degrees, not including the end points). In some embodiments, second facet 400 is tilted with respect to the principal direction of propagation of the light within substrate 302. In some embodiments, second facet 400 is an etched surface of substrate 302 (e.g., second facet 400 is produced by etching a portion of top surface 304 of substrate 302). In some embodiments, second facet 400 is formed using a wet-etching process on substrate 302, where the wet-etching process is anisotropic (e.g., the etching process has one or more preferred crystallographic directions that determine the orientation of second facet 400 relative to top surface 304 of substrate 302). A preferred crystallographic direction in the context of etching means that the etching proceeds faster along the preferred crystallographic direction than a non-preferred crystallographic direction (e.g., any non-preferred crystallographic direction). For example, substrate 302 comprises an InP chip or wafer and top surface 304 is a (001) crystal plane. Photodiode chip 300 includes a cavity 404, where one of the sidewalls of cavity 404 is second facet 400. In some embodiments, a chemical etchant such as a mixture of bromic acid, hydrogen peroxide, and water ($HBr:H_2O_2:H_2O$) is used to etch cavity 404 (FIG. 4) in the photodiode chip, with sidewalls in the shape of a dovetail; for example, the sidewalls of cavity 404 have a negative slope along the (110) planes relative to the (001) InP surface. In such embodiments, second facet 400 is slanted at an angle of about 55 degrees with respect to top surface 304. Alternatively, in some embodiments, the principles of the present disclosure are applied using a cavity etched in the shape of a V-groove (e.g., with a positive slope along the ($\bar{1}$10) planes). Thus, in some embodiments, second facet 400 is a crystallographic plane. In some embodiments, the crystallographic plane is predetermined (e.g., by choice of etch) with respect to a crystallographic plane of top surface 304.

In some embodiments, photodiode 308 is a PIN diode. In some embodiments, the PIN diode is an InAsGas-based PIN diode (e.g., having an InGaAs layer grown epitaxially on the InP substrate). In some embodiments, photodiode 308 is fabricated entirely on top surface 304 of substrate 302 (e.g., both the anode and cathode are formed on top surface 304 of substrate 302, obviating the need for back-side metallization). As shown in FIG. 3, the PIN diode includes an anode electrode 312 electrically coupled with a p-type region of the PIN diode and a cathode electrode 314 electrically coupled with an n-type region of the PIN diode. Sandwiched between the p-type and n-type regions of the PIN diode is an intrinsic layer forming the photoactive region of the PIN diode. Light incident on the photoactive region of the PIN diode results in a photocurrent offset to the I-V (current-voltage) characteristics between the anode and cathode, thus facilitating measurement of light intensity.

When a photodiode, such as photodiode 308, is described herein as being fabricated "on" a top surface of a substrate (e.g., such as top surface 304 of substrate 302), that means the photodiode is fabricated using "top side" fabrication processes (such as lithographic, metallization, doping, and other processes). For example, a photodiode is fabricated on a top surface of a substrate when the processes used to fabricate the photodiode are applied to the top surface of the substrate (e.g., all of the fabrication processes are applied to the top surface so that there is no need for "back side" processes). Therefore, a photodiode is said to be fabricated on a top surface of a substrate even if some layers of the photodiode extend into the bulk of the substrate. In some embodiments, photodiode 308 is fabricated using exclusively top-side processes (e.g., top-side lithography). In such embodiments, photodiode 308 does not include any back-side components (i.e., any components fabricated on a back surface of the substrate that is opposite the top surface of the substrate). In some embodiments, photodiode 308 is fabricated without back-side processing (e.g., back-side processes which require back-side alignment).

In some embodiments, under operating conditions (e.g., when operated under ambient conditions and/or in air), the light that has entered substrate 302 through the first facet along the optical axis S is totally internally reflected by second facet 400 (e.g., for a designed-for range of wavelengths). Total internal reflection is used herein as a term of art to mean that light that has entered substrate 302 through first facet 306 along the optical axis S is incident upon second facet 400 at an angle that is greater than a critical angle $\theta_c$. The critical angle is defined as follows:

$$\sin \theta_c = \frac{n_c}{n_s}$$

In the equation above, $n_s$ is the refractive index of the bulk of substrate 302 (e.g., the refractive index of InP, which is about 3.2) and $n_c$ is the refractive index of the cavity (e.g., the refractive index of air, which is about 1). For an InP substrate operating in air, the critical angle is about 18 degrees.

Note that, since not all of the light enters first facet 306 along the optical axis S (e.g., because of beam divergence), not all light is necessarily totally internally reflected. Total internal reflection of light (within a designed-for range of wavelengths) incident along the optical axis is solely a question of ray tracing from the optical axis (a property of the device) to second facet 400 (whose characteristics are also a property of the device). Total internal reflection of light incident along the optical axis is thus a property of the designed optical axis, the refractive properties of substrate 302, and the geometry of the cavity.

In some embodiments, second facet 400 is coated with a reflective coating or a passivation coating.

In some embodiments, light received along the optical axis remains within photodiode chip 300 (e.g., is not exposed to ambient conditions such as air) until impinging photodiode 308. In some embodiments (e.g., when photodiode 308 is incorporated into an assembly with a well-characterized laser diode), all of the light within the laser diode's footprint is totally internally reflected (e.g., each ray within the laser diode's footprint is incident upon second facet 400 at an angle of incidence greater than the critical angle).

FIG. 6A illustrates a top view of an assembly 600, in accordance with some embodiments. FIG. 6B illustrates a side view of assembly 600. Assembly 600 includes a laser diode 606 and a photodiode chip 610 (an optoelectronic device) that monitors optical power transmitted from a back facet 608 of laser diode 606 (photodiode chip 610 is a photodetector for laser diode 606). In some embodiments, laser diode 606 is a transmitter in an optical communications system (e.g., laser diode 606 transmits modulated light to a remote destination via an optical fiber). Photodiode chip 610 is disposed on the same flat common mounting surface 604 of a sub-mount 602 as laser diode 606. Photodiode chip 610 is rotated with respect to laser diode 606 along an axis perpendicular to the flat mounting surface 604 of sub-mount 602 so that the optical axis of photodiode chip 610 is aligned with a principal direction of propagation of the light produced by laser diode 606. In some embodiments, assembly 600 is disposed within a transistor outline package (more commonly referred to as a TO package or, more specifically, a TO can).

To that end, assembly 600 includes laser diode 606 that emits light along a principal direction of propagation that is non-normal to first facet 616 of photodiode chip 610. In particular, the light emitted by laser diode 606 is aligned with the optical axis of photodiode chip 610, and the optical axis is non-normal to first facet 616 of photodiode chip 610. In various embodiments, photodiode chip 610 shares any (e.g., one or more) of the features of photodiode chip 300 described with references to FIG. 3 and FIG. 4. Because assembly 600 includes both photodiode chip 610 and laser diode 606, the principal direction of propagation of the light emitted from laser diode 606, with respect to first facet 616 of photodiode chip 610 (e.g., aligned with the optical axis of photodiode chip 610), is a property of assembly 600 (e.g., a geometrical property).

Assembly 600 includes sub-mount 602 having mounting surface 604 (e.g., a flat mounting surface). Laser diode 606 is mounted on mounting surface 604 of sub-mount 602. Laser diode 606's back facet 608 emits light principally along a first direction 605. Photodiode chip 610 is also mounted on mounting surface 604 of sub-mount 602 (e.g., laser diode 606 and photodiode chip 610 are mounted on a common flat mounting surface). Photodiode chip 610 includes a substrate 612 having a top surface 614 and first facet 616 perpendicular to top surface 614. Photodiode chip 610 is rotated with respect to back facet 608 of laser diode 606 so that light emitted principally along first direction 605 from back facet 608 of laser diode 606 enters substrate 612 through first facet 616 along an optical axis of photodiode chip 610 that is non-normal to first facet 616. Photodiode chip 610 includes a second facet (e.g., analogous to second facet 400 as shown in FIG. 4) onto which the light that has entered substrate 612 through first facet 616 along the non-normal optical axis is incident. Photodiode chip 610 includes a photodiode 620 fabricated on top surface 614 of substrate 612 for measuring an intensity of the light that has entered substrate 612 through first facet 616 along the non-normal optical axis. Light that has entered substrate 612 through first facet 616 along the non-normal optical axis is reflected by the second facet toward a photoactive region of photodiode 620.

In some embodiments, photodiode chip 610 is rotated with respect to back facet 608 of laser diode 606 so that first facet 616 of photodiode chip 610 is rotationally offset from back facet 608 (e.g., rotated with respect to back facet 608) of laser diode 606 (e.g., yawed about an axis perpendicular to mounting surface 604) by at least 7 degrees. More generally, first facet 616 of photodiode chip 610 is rotated (e.g., yawed about an axis perpendicular to mounting surface 604) between 5 and 30 degrees with respect to back facet 608 of laser diode 606. Thus, any light reflected by first facet 616 is not directed back toward laser diode 606, avoiding damage to laser diode 606.

In some embodiments, a bottom surface of substrate 612 is mounted to mounting surface 604 of sub-mount 602 (e.g., photodiode chip 610 is not mounted as a flip-chip). In some embodiments, the bottom surface of substrate 612 is directly mounted to mounting surface 604 (e.g., the bottom surface of substrate 612 lies flat on mounting surface 604). Top surface 614 of substrate 612 is further from (or distal to) mounting surface 604 of sub-mount 602 than bottom surface of substrate 612.

In some embodiments, photodiode chip 610 is used to monitor an intensity of light emitted from a front facet 618 of laser diode 606 based on the measured intensity of the light that has entered substrate 612 of photodiode chip 610 from back facet 608 of laser diode 606 (e.g., using Equation (1)). In some embodiments, assembly 600 further includes feedback circuitry (e.g., feedback circuitry 220, FIG. 2A) for stabilizing the intensity of the light emitted from front facet 618 of laser diode 606 based on the measured intensity of the light that has entered substrate 612 from back facet 608 of laser diode 606.

In some embodiments, first facet 616 is a side surface of substrate 612. In some embodiments, first facet 616 is a cleavage plane of substrate 612 (e.g., a crystallographic plane of substrate 612). Thus, some embodiments make fabrication of photodiode chip 610 easier, simpler, and cheaper by, for example, obviating the need to etch the surface through which light enters substrate 612. In addition, because in some embodiments the second facet is a facet that was etched into substrate 612 (as described with reference to FIG. 4) along a preferred crystallographic direction, using a crystallographic plane for first facet 616 aides in orienting first facet 616 with the second facet. Stated another way, the second facet is a facet that was formed by etching the substrate, in accordance with some embodiments. Furthermore, in some embodiments, the ease with which a substrate fractures along a crystallographic plane also makes fabrication of the photodiode chip 610 simpler and cheaper (the crystallographic plane is a cleavage plane). For example, by scoring or sawing a wafer roughly along the crystallographic plane, the wafer will naturally fracture along the crystallographic plane, automatically aligning first facet 616 with the second facet (which is also oriented based on crystallographic properties of the wafer).

In some embodiments, back facet 608 of laser diode 606 is perpendicular to mounting surface 604 of sub-mount 602. In some embodiments, first facet 616 of substrate 612 is perpendicular to mounting surface 604 of sub-mount 602. Thus, in some embodiments, the rotation of first facet 616 of substrate 612 with respect to back facet 608 of laser diode 606 is solely a yaw about an axis perpendicular to common mounting surface 604.

In some embodiments, top surface 614 of substrate 612 is parallel to mounting surface 604 of sub-mount 602. Thus, in some embodiments, substrate 612 is a flat wafer or chip (e.g., a piece of a wafer).

In some embodiments, as described with references to FIGS. 3 and 4, under operating conditions, the light that has entered substrate 612 through first facet 616 from back facet 608 of laser diode 606 is totally internally reflected by the second facet.

In some embodiments, assembly 600 is designed, geometrically speaking, so that photodiode chip 610 captures as much of the light emitted from back facet 608 of laser diode 606 as possible and directs the light to the photoactive region of photodiode 620. To that end, because light is emitted from the top of back facet 608 of laser diode 606, and accounting for the divergence of the light (e.g., the cone shape of the light), in some embodiments, photodiode chip 610 has a height $h_1$ that is taller than (e.g., greater than) a height $h_2$ of laser diode 606 to capture light that has diverged upward. For example, in some embodiments, laser diode 606 has a height of about 100 microns (e.g., between 75-150 microns), laser diode 606 and photodiode chip 610 are separated by a distance of about 100 microns (e.g., between 50-200 microns), and photodiode chip 610 has a height of about 150 microns (e.g., between 100-200 microns). These dimensions are just examples.

It will be understood that, although the terms "first," "second," etc. are sometimes used herein to describe various elements, these elements should not be limited by these terms. These terms are only used to distinguish one element from another. For example, a first element could be termed a second element, and, similarly, a second element could be termed a first element, without changing the meaning of the description, so long as all occurrences of the "first element" are renamed consistently and all occurrences of the second element are renamed consistently. The first element and the second element are both elements, but they are not the same element.

The terminology used herein is for the purpose of describing particular embodiments only and is not intended to be limiting of the claims. As used in the description of the embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, operations, elements, and/or components, but do not preclude the presence or addition of one or more other features, integers, operations, elements, components, and/or groups thereof.

The foregoing description, for purpose of explanation, has been described with reference to specific embodiments. However, the illustrative discussions above are not intended to be exhaustive or to limit the embodiments to the precise forms disclosed. Many modifications and variations are possible in view of the above teachings. The embodiments were chosen and described in order to best explain the principles of the disclosure and its practical applications, to thereby enable others skilled in the art to best utilize the various embodiments with various modifications as are suited to the particular use contemplated.

What is claimed is:

1. A device comprising:
    a substrate having:
        a top surface;
        a first facet perpendicular to the top surface through which light enters the substrate; and
        a second facet onto which light that has entered the substrate through the first facet with a principal direction of propagation aligned with an optical axis of the device is incident, wherein the optical axis of the device is non-normal to the first facet and parallel to the top surface; and
    a photodiode fabricated on the top surface of the substrate for measuring an intensity of the light that enters the first facet of the substrate with the principal direction of propagation aligned with the optical axis of the device;
    wherein the light that has entered the substrate through the first facet with the principal direction of propagation aligned with the optical axis that is non-normal to the first facet is reflected by the second facet toward a photoactive region of the photodiode.

2. The device of claim 1, wherein the first facet is a side surface of the substrate.

3. The device of claim 1, wherein the first facet is a cleavage plane of the substrate.

4. The device of claim 3, wherein the second facet is a facet that was etched into the substrate.

5. The device of claim 1, wherein the optical axis of the device is between 5 and 30 degrees off of a normal direction to the first facet.

6. The device of claim 5, wherein the optical axis of the device is at least 7 degrees off of a normal direction to the first facet.

7. The device of claim 1, wherein, under operating conditions, the light that has entered the substrate through the first facet aligned with the optical axis is totally internally reflected by the second facet.

8. An assembly, comprising:
a sub-mount having a mounting surface;
a laser diode mounted on the mounting surface of the sub-mount, the laser diode having a back facet that emits light with a principal direction of propagation along a first direction;
a photodiode chip mounted on the mounting surface of the sub-mount, the photodiode chip comprising:
a substrate having:
a top surface;
a first facet perpendicular to the top surface through which light emitted from the back facet of the laser diode is incident, wherein the photodiode chip is rotated with respect to the back facet of the laser diode so that light emitted with a principal direction of propagation along the first direction from the back facet of the laser diode enters the substrate through the first facet with the principal direction of propagation aligned with an optical axis of the photodiode chip that is non-normal to the first facet and parallel to the top surface; and
a second facet onto which the light that has entered the substrate through the first facet aligned with the optical axis of the photodiode chip is incident; and
a photodiode fabricated on the top surface of the substrate for measuring an intensity of the light that has entered the substrate through the first facet aligned with the optical axis of the photodiode chip;
wherein the light that has entered the substrate through the first facet with the principal direction of propagation aligned with the optical axis of the photodiode chip is reflected by the second facet toward a photoactive region of the photodiode.

9. The assembly of claim 8, wherein a bottom surface of the substrate is mounted to the mounting surface of the sub-mount.

10. The assembly of claim 8, wherein the photodiode chip monitors an intensity of light emitted from a front facet of the laser diode based on the measured intensity of the light that has entered the substrate of the photodiode chip from the back facet of the laser diode.

11. The assembly of claim 10, further comprising feedback circuitry for stabilizing the intensity of the light emitted from the front facet of the laser diode based on the measured intensity of the light that has entered the substrate from the back facet of the laser diode.

12. The assembly of claim 8, wherein the first facet is a side surface of the substrate.

13. The assembly of claim 8, wherein the first facet is a cleavage plane of the substrate.

14. The assembly of claim 13, wherein the second facet is a facet that was etched into the substrate.

15. The assembly of claim 8, wherein the back facet of the laser diode is perpendicular to the mounting surface of the sub-mount.

16. The assembly of claim 8, wherein the first facet of the substrate is perpendicular to the mounting surface of the sub-mount.

17. The assembly of claim 8, wherein the top surface of the substrate is parallel to a surface of the sub-mount.

18. The assembly of claim 8, wherein, under operating conditions, the light that has entered the substrate through the first facet from the back facet of the laser diode is totally internally reflected by the second facet.

19. The assembly of claim 8, wherein the optical axis of the photodiode chip is between 5 and 30 degrees off of a normal direction to the first facet of the substrate.

20. The assembly of claim 19, wherein the first facet of the substrate is rotated at least 7 degrees with respect to the back facet of the laser diode in a plane of the mounting surface of the sub-mount.

* * * * *